(12) United States Patent
Zundel et al.

(10) Patent No.: US 9,391,192 B2
(45) Date of Patent: Jul. 12, 2016

(54) FIELD EFFECT SEMICONDUCTOR COMPONENT AND METHOD FOR PRODUCING IT

(71) Applicant: Infineon Technologies AG, Neubiberg (DE)

(72) Inventors: Markus Zundel, Egmating (DE); Karl-Heinz Bach, Groebenzell (DE); Andrew Christopher Graeme Wood, St. Jakob im Rosental (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/525,398

(22) Filed: Oct. 28, 2014

(65) Prior Publication Data

US 2015/0115353 A1 Apr. 30, 2015

(30) Foreign Application Priority Data

Oct. 30, 2013 (DE) .................. 10 2013 111 966

(51) Int. Cl.
| | |
|---|---|
| *H01L 29/78* | (2006.01) |
| *H01L 29/66* | (2006.01) |
| *H01L 29/739* | (2006.01) |
| *H01L 29/10* | (2006.01) |
| H01L 29/40 | (2006.01) |
| H01L 29/423 | (2006.01) |

(Continued)

(52) U.S. Cl.
CPC ........ *H01L 29/7813* (2013.01); *H01L 29/1095* (2013.01); *H01L 29/6634* (2013.01); *H01L 29/66348* (2013.01); *H01L 29/66727* (2013.01); *H01L 29/66734* (2013.01); *H01L 29/7397* (2013.01); *H01L 29/7811* (2013.01); *H01L 29/0661* (2013.01); *H01L 29/0878* (2013.01); *H01L 29/407* (2013.01); *H01L 29/42376* (2013.01)

(58) Field of Classification Search
CPC ..................... H01L 29/7813; H01L 29/66734; H01L 29/7835; H01L 29/0847; H01L 29/0615; H01L 29/0634; H01L 29/41733; H01L 29/1095; H01L 29/6634; H01L 29/66348; H01L 29/66727; H01L 29/7397; H01L 29/7811; H01L 29/0661
USPC ......................................................... 257/330
See application file for complete search history.

(56) References Cited

U.S. PATENT DOCUMENTS 5,072,266 A * 12/1991 Bulucea .............. H01L 29/0696
257/330
7,393,749 B2 7/2008 Yilmaz et al.

(Continued)

FOREIGN PATENT DOCUMENTS

WO 2006011882 A1 2/2006

*Primary Examiner* — Karen Kusumakar
*Assistant Examiner* — Adam S Bowen
(74) *Attorney, Agent, or Firm* — Eschweiler & Associates, LLC

(57) ABSTRACT

What is provided is a field effect component including a semiconductor body, which extends in an edge zone from a rear side as far as a top side and which includes a semiconductor mesa, which extends in a vertical direction, which is perpendicular to the rear side and/or the top side. The semiconductor body in a vertical cross section further includes a drift region, which extends at least in the edge region as far as the top side and which is arranged partly in the semiconductor mesa, and a body region, which is arranged at least partly in the semiconductor mesa and which forms a pn junction with the drift region. The pn junction extends between two sidewalls of the semiconductor mesa.

20 Claims, 9 Drawing Sheets

(51) Int. Cl.
*H01L 29/06* (2006.01)
*H01L 29/08* (2006.01)

(56) References Cited

U.S. PATENT DOCUMENTS

| | | | |
|---|---|---|---|
| 8,742,401 B2 | 6/2014 | Yilmaz et al. | |
| 2003/0102564 A1* | 6/2003 | Darwish | H01L 21/2253 257/769 |
| 2004/0212011 A1* | 10/2004 | Ryu | H01L 29/872 257/335 |
| 2005/0280004 A1* | 12/2005 | Das | H01L 29/1095 257/77 |
| 2006/0197152 A1* | 9/2006 | Tokano | H01L 29/0634 257/341 |
| 2006/0214221 A1* | 9/2006 | Challa | H01L 21/3065 257/328 |
| 2007/0246791 A1* | 10/2007 | Schulze | H01L 29/0615 257/495 |
| 2009/0008723 A1* | 1/2009 | Schmidt | H01L 21/26586 257/409 |
| 2010/0078756 A1* | 4/2010 | Schmidt | H01L 23/3171 257/499 |
| 2010/0133549 A1* | 6/2010 | Zhang | H01L 29/0619 257/77 |
| 2010/0301410 A1* | 12/2010 | Hirler | H01L 29/7813 257/334 |
| 2012/0146133 A1* | 6/2012 | Hirler | H01L 21/76898 257/330 |
| 2012/0153386 A1* | 6/2012 | Hirler | H01L 29/0623 257/334 |
| 2012/0256192 A1* | 10/2012 | Zhang | H01L 29/0619 257/77 |
| 2012/0306046 A1* | 12/2012 | Schmidt | H01L 29/0638 257/506 |
| 2013/0062723 A1* | 3/2013 | Henning | H01L 29/8611 257/484 |

* cited by examiner

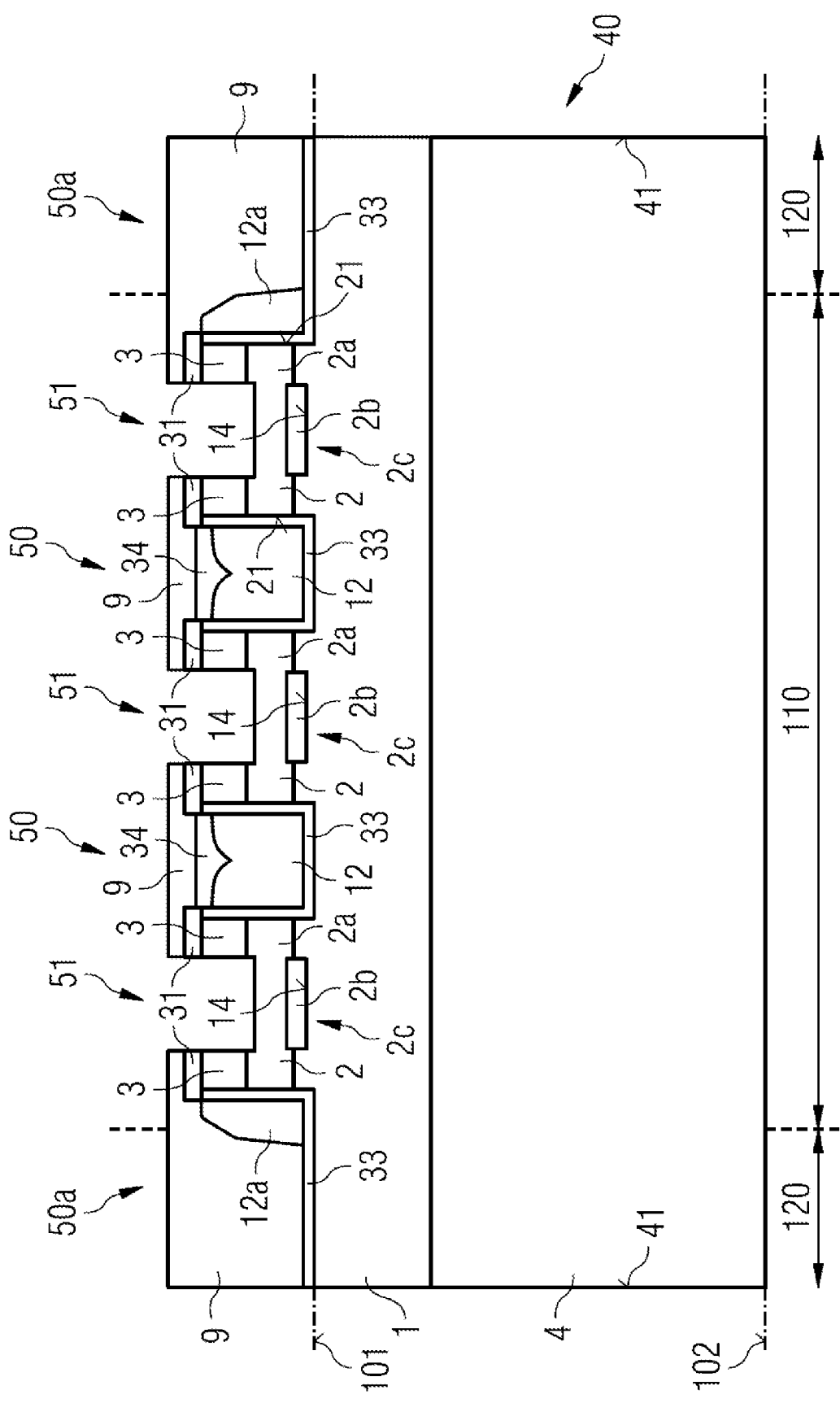

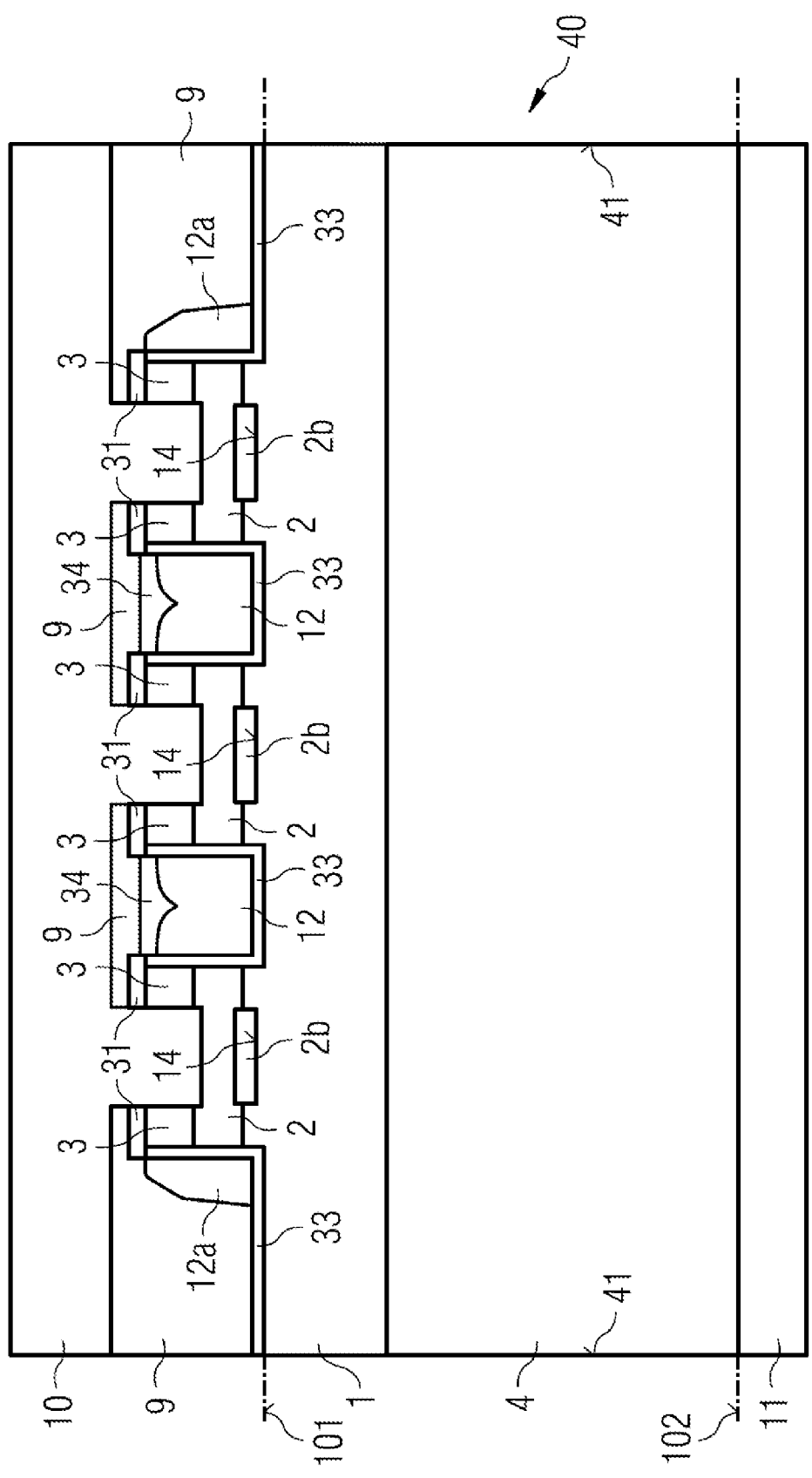

FIELD EFFECT SEMICONDUCTOR COMPONENT AND METHOD FOR PRODUCING IT

REFERENCE TO RELATED APPLICATION

This application claims priority to German application number 10 2013 111 966.2 filed on Oct. 30, 2013.

FIELD

Embodiments of the present disclosure relate to field effect semiconductor components, in particular to vertical field effect semiconductor transistors, and to production methods for field effect semiconductor components.

BACKGROUND

Semiconductor transistors, in particular field effect-controlled semiconductor transistors such as n-metal-oxide semiconductor field effect transistors (MOSFETs) and insulated-gate bipolar transistors (IGBTs) are used for a variety of applications, including in particular as switches in power supplies and power converters, electric automobiles, air-conditioning systems and also stereo systems.

Hitherto, power semiconductor components have been optimized principally with regard to a low on resistance (Ron) in conjunction with the smallest possible area requirement (A), in particular with regard to a low product Ron*A, fast switching and/or low switching losses. Inductive loads can generate large voltage spikes during the switching process, and power semiconductor components being driven need additionally to be protected against said spikes.

Particularly for high-power circuits, use is often made of DMOS field effect transistors, e.g. DMOSFETs (double-diffused metal-oxide semiconductor field effect transistor), the channel structures of which are produced by double implantation. Hitherto, DMOS transistors have been embodied either as planar DMOS transistors or as trench MOS transistors. The planar DMOS transistors require a relatively large amount of semiconductor area particularly in the case of relatively high reverse voltages (>30 V), which makes the products expensive. The trench MOS transistors require very much less semiconductor area, but are associated with an increased process outlay during their production, e.g. in order to provide an edge termination suitable for the voltage class. In general, in the case of the trench MOS transistors the gain in area exceeds the additional process outlay, as a result of which a cost saving is obtained overall. In the case of energy-limited and/or so-called multi-chip products (further signal pads and lines are required here in addition to the DMOS transistor), said gain in area cannot be fully utilized, however, since a certain minimum semiconductor area is required for the energy to be commutated and/or lines and pads. However, this area is expensive in the case of complex DMOS technologies.

Therefore, there is a need for improved field effect semiconductor components and improved production methods for field effect semiconductor components.

SUMMARY

In accordance with one embodiment, a field effect component comprises a semiconductor body, which extends in an edge zone from a rear side as far as a surface and which comprises a semiconductor mesa, which extends at least in a vertical direction, which is substantially perpendicular to the rear side and/or the surface, as far as a semiconductor mesa top side arranged at a height above the surface. In this case, the semiconductor body in a vertical cross section comprises a drift region, which extends in the edge region as far as the surface and which is arranged partly in the semiconductor mesa, and a body region, which is arranged at least partly in the semiconductor mesa and which forms a first pn junction with the drift region, wherein the first pn junction extends between two sidewalls of the semiconductor mesa, wherein a vertical distance between the first pn junctions and the semiconductor mesa top side varies in a horizontal direction and assumes a largest value in a central zone spaced apart from the two sidewalls, and wherein the largest value is at least 70% of the height.

In accordance with one embodiment, a field effect component comprises a semiconductor body, which extends in an edge zone from a rear side as far as a surface and which comprises a semiconductor mesa, which extends in a vertical direction, which is substantially parallel to a normal vector of the rear side and/or a normal vector of the surface, as far as a semiconductor mesa top side arranged above the surface. In a vertical cross section the semiconductor body further comprises a drift region, which extends at least in the edge region as far as the surface and which is arranged partly in the semiconductor mesa, and a body region, which is arranged at least partly in the semiconductor mesa and which comprises two first partial zones, each adjoining one of two sidewalls of the semiconductor mesa, and a second partial zone arranged between the two first partial zones, wherein the two first partial zones and the second partial zone form a first pn junction with the drift region, said first pn junction extending between the two sidewalls of the semiconductor mesa, wherein the second partial zone extends into the drift region vertically more deeply than the two first partial zones, and wherein the second partial zone has a greater maximum dopant concentration than each of the two first partial zones.

In accordance with one embodiment, a method for producing a field effect component comprises the following steps: providing a wafer, comprising a first semiconductor layer of a first conduction type, a second semiconductor layer of a second conduction type, which is arranged on the first semiconductor layer and which forms a first pn junction with the first semiconductor layer, and a third semiconductor layer, which is arranged on the second semiconductor layer and which forms a second pn junction with the second semiconductor layer and extends as far as a top side of the wafer; forming a mesa mask on the top side of the wafer with a plurality of openings; etching the wafer through the mesa mask, thus giving rise to deep tranches and semiconductor mesas arranged between the deep trenches, wherein the deep trenches extend right into the first semiconductor layer; and implanting dopants of the first conduction type into at least one semiconductor zone adjoining the first pn junction.

Further features and advantages will become apparent to the person skilled in the art upon reading the following detailed description and considering the figures.

BRIEF DESCRIPTION OF THE DRAWINGS

The component parts in the figures are not necessarily true to scale, emphasis being placed rather on the elucidation of the basic concepts of the disclosure. Moreover, in the figures, identical reference numerals designate corresponding parts. In the figures:

FIGS. 3 to 9 show vertical cross sections through a semiconductor wafer during and after steps of a method in accordance with embodiments.

DETAILED DESCRIPTION

Figure 1A:
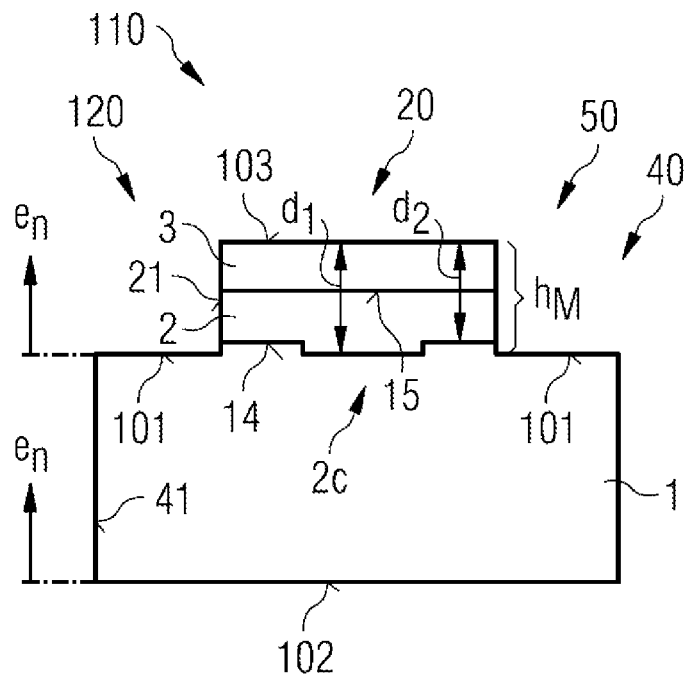
FIGS. 1A and 1B show vertical cross sections through field effect semiconductor components in accordance with embodiments.

In the following detailed description, reference is made to the figures, which are part of this document and which illustratively represent specific embodiments in which the invention can be realized in practice. Direction indications such as "at the top", "at the bottom", "at the front", "at the back", "front", "rear" etc., are used with reference to the described orientation of the figure(s). Since component parts of embodiments can be positioned in a series of different orientations, the direction indications are used for illustration purposes and are in no way restrictive. It is pointed out that further embodiments can be used and structural or logical modifications can be made, without departing from the scope of the disclosure. The following detailed description should therefore not be interpreted in a restrictive sense and the scope of the present disclosure is determined by the claims. In this context, it is additionally pointed out that features or feature combinations, e.g. materials or the combination thereof and/or the arrangement of zones, which are disclosed explicitly only with reference to a device in the description, drawings and/or in the claims, for the person skilled in the art also concomitantly disclose corresponding features or feature combinations of the associated production method, unless indicated otherwise. Analogously, for the person skilled in the art, features or feature combinations which are disclosed explicitly only with reference to a production method in the description, drawings and/or in the claims also disclose corresponding features or feature combinations of the device produced.

Various embodiments will now be discussed in detail, one or more examples of which are illustrated in the figures. Each example is given for explanation purposes and is not understood as a restriction of the invention. By way of example, features illustrated or described as part of one specific embodiment can be used in the case of or in association with other embodiments, thus resulting in a further embodiment. The present disclosure is intended to include such modifications and variations. The examples are described using a specific language, which should not be interpreted as a restriction of the scope of the appended claims. The drawings cannot be true to scale and serve only for illustrative purposes. For reasons of clarity, identical elements or production steps in the different drawings have been designated by the same reference signs, unless indicated otherwise.

In the context of this description, the expression "horizontal" is intended to denote a direction which extends substantially parallel to a first or horizontal surface of a semiconductor substrate or semiconductor body. This can be the surface of a wafer or chip, for example.

In the present description, it is assumed that a second surface of a semiconductor substrate or semiconductor body is formed by a lower or rear-side surface (rear side), which is typically planar and parallel to the first surface.

In the context of this description, the expression "vertical" is intended to denote a direction which is substantially at right angles to the first surface and/or second surface, i.e. is substantially parallel to a direction of a normal to the first surface and/or a direction of a normal to the second surface of the semiconductor substrate or semiconductor body. The terms "above" and "below" describe the relative arrangement of one structural feature in relation to another structural feature with regard to the vertical direction.

In the context of the present patent specification, the synonymously used terms "mesa" and "semiconductor mesa" are intended to describe a semiconductor zone between two adjacent trenches which extend into the semiconductor substrate or the semiconductor body in a vertical cross section. Typically, at least two semiconductor regions forming a pn junction are arranged in the semiconductor mesa.

Typically, in an active region a multiplicity of semiconductor mesas extend in the vertical direction from the first surface as far as a top side—arranged above the first surface—of the semiconductor substrate or of the semiconductor body, or define said top side. The top side of the semiconductor substrate or of the semiconductor body is also designated hereinafter as semiconductor mesa top side. Typically, the semiconductor mesa top side is substantially parallel to the first surface and/or second surface.

In this patent specification, n-doped semiconductor zones are designated as semiconductor zones of the first conduction type, while p-doped semiconductor zones are designated as semiconductor zones of the second conduction type. As an alternative thereto, the semiconductor components can be embodied with opposite doping relations, such that the first conduction type can correspond to a p-type doping and the second conduction type can correspond to an n-type doping. Furthermore, in some figures relative doping concentrations are indicated by a "−" or "+" being appended to the doping type. By way of example, "$n^-$" denotes a doping concentration that is less than the doping concentration of an "n"-type doping zone, while an "$n^+$"-type doping zone has a higher doping concentration than the "n"-type doping zone. If the relative doping concentration is indicated, that does not mean, however, that doping zones having the same relative doping concentration must have the same absolute doping concentration, unless indicated otherwise. By way of example, two different $n^+$-type doping zones can have different absolute doping concentrations. The same applies, for example, to an $n^+$-type doping zone and a $p^+$-type doping zone.

Specific embodiments described in this patent specification are directed in particular, but not exclusively, to field effect semiconductor components, in particular to field effect semiconductor transistors, such as vertical MOSFETs, and production methods therefor.

Typically, a vertical power MOSFET is involved comprising a source metallization arranged on the top side, and comprising an insulated gate electrode arranged in the vicinity of the top side, typically in trenches between the semiconductor mesas, and comprising a drain metallization arranged on an oppositely arranged rear side. The metallizations typically also provide corresponding terminals, for example in contact area zones. The vertical semiconductor power transistor typically includes in an active zone a plurality of cells, for example MOSFET cells, for carrying and/or controlling a load current. Furthermore, as viewed from above, the active area can be surrounded at least partly by at least one edge termination structure.

In the context of the present description, the expression "metallization" is intended to describe a zone or a layer having metallic or almost metallic properties in relation to the electrical conductivity. A metallization can be in contact with a semiconductor zone and thus form an electrode, a contact area (pad) and/or a terminal of the semiconductor component. The metallization can consist of or comprise a metal such as Al, Ti, W, Cu and Co, but can also be produced from a material having metallic or almost metallic properties in relation to the electrical conductivity, such as heavily n- or p-doped poly-Si, TiN or an electrically conductive silicide such as $TaSi_2$, $TiSi_2$, $PtSi$, $CoSi_2$, $WSi_2$ or the like. The metallization can also comprise different electrically conductive materials, for example a stack of said materials.

The expression "edge termination structure", as used in the present patent specification, is intended to describe a structure which provides a transition zone in which the high electric fields around an active zone of the semiconductor component gradually change to the potential at the edge of the component and/or to a reference potential such as ground. The edge termination structure can reduce the field intensity in the vicinity of a pn junction, for example, by distributing the electric field lines over a termination zone.

In the context of this patent specification, the expression "power semiconductor component" is intended to describe a semiconductor component on an individual chip having high-voltage and/or high-current control or switching capability. In other words: power semiconductor components are intended for high currents, typically in the amperes range, and/or high voltages of above approximately 10 V or even above approximately 500 V. In the context of the present document, the terms "power semiconductor component" and "power semiconductor device" are used synonymously.

In the context of this patent specification, the expression "field effect" is intended to denote the formation—mediated by an electric filed—of a conductive "channel" of a first conduction type and/or the control of the conductivity and/or form of the channel in a semiconductor zone of a second conduction type, typically a body zone of the second conduction type. On the basis of the field effect, the channel zone forms and/or controls a unipolar current path between a source zone of the first conduction type adjoining the body zone and a drift zone of the first conduction type adjoining the body zone. The drift zone can be in contact with a more highly doped drain zone of the first conduction type.

The drain zone is in ohmic contact with a drain metallization. The source zone and the body zone are in ohmic contact with a source metallization. In the context of the present document, the expression "in ohmic contact" is intended to denote the fact that an ohmic current path is present between corresponding elements or sections of a semiconductor component if no voltages or only low test voltages are applied to and/or across the semiconductor component. In the context of this patent specification, the expressions "in electrical contact", "electrically connected" and "in ohmic contact" are used synonymously.

In context of the present patent specification, the term "MOS" (metal-oxide semiconductor) should be understood as inclusive of the more general term "MIS" (metal insulator semiconductor). By way of example, the term MOSFET (metal-oxide semiconductor field effect transistor) should be understood such that it also includes field effect transistors (FETs) having a gate insulator that is not an oxide, i.e. the expression MOSFET is used in the more general meaning of IGFET (insulated gate field effect transistor) or MISFET (metal insulator semiconductor field effect transistor).

In the context of the present patent specification, the expression "switch" is intended to describe a semiconductor structure, typically a power MOSFET or a power IGBT, which is configured such that it can carry a load current, typically in the amperes range, and can interrupt the load current.

In the context of the present patent specification, the expression "gate electrode" is intended to denote an electrode which is adjacent to and insulated from the body zone and is configured such that suitable driving of the gate electrode makes it possible to form and/or control a channel zone between the source zone and the drift zone through the body zone.

Hereinafter, embodiments relating to semiconductor components and production methods for forming semiconductor components are principally explained with reference to silicon (Si) semiconductor components. Accordingly, a monocrystalline semiconductor zone or a monocrystalline semiconductor layer is typically a monocrystalline Si zone or Si layer. However, it should be pointed out that the semiconductor body can be produced from any semiconductor material suitable for producing a semiconductor component. Examples of such materials include in particular elemental semiconductor materials such as silicon (Si) or germanium (Ge), compound semiconductor materials of group IV such as silicon carbide (SiC) or silicon-germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe), to name just a few. The abovementioned semiconductor materials are also designated as homojunction semiconductor materials. If two different semiconductor materials are combined, a heterojunction semiconductor material is formed. Examples of heterojunction semiconductor materials include in particular, without being restricted thereto, aluminum gallium nitride (AlGaN)-aluminum gallium indiumnitride(AlGaInN), indium gallium nitride(InGaN)-aluminum gallium indium nitride(AlGaInN), indium gallium nitride(InGaN)-gallium nitride(GaN), aluminum gallium nitride(AlGaN)-gallium nitride(GaN), indium gallium nitride(InGaN)-aluminum gallium nitride(AlGaN), silicon-silicon carbide ($Si_xC_{1-x}$) and silicon-SiGe heterojunction semiconductor materials. At the present time, Si, SiC, GaAs and GaN materials are principally used for power semiconductor applications. If the semiconductor body comprises a material having a high band gap (>2 eV), such as SiC or GaN, which has a high breakdown field strength or a high critical avalanche field strength, the doping of the corresponding semiconductor zones can be chosen to be higher, which reduces the ON state resistance $R_{ON}$, which hereinafter is also designated as the on resistance $R_{ON}$.

FIG. 1A shows a vertical section through a vertical field effect semiconductor component 100a. The field effect semiconductor component 100a comprises a semiconductor body 40, which extends in an edge region 120 extending as far as a substantially vertically oriented side face or edge 41, e.g. a sawing edge, which extends from a rear side 102 as far as a first surface 101 of the semiconductor body 40. Hereinafter, the first surface 101 is also designated as surface 101. The rear side 102 is formed by a second surface of the semiconductor body 40, said second surface typically being substantially parallel to the first surface 101, as is discernible from the two normal vectors $e_n$ depicted. Moreover, the semiconductor body 40 has a semiconductor mesa 20 having two substantially vertically oriented sidewalls 21, of which only the left sidewall is provided with the reference sign 21, however, for reasons of clarity in FIG. 1A. The semiconductor mesa 20 has a vertical height or maximum vertical extent $h_M$. Depending on the voltage class, the height $h_M$ can be in a range of approximately 500 nm to approximately 5 μm, typically in a range of approximately 500 nm to approximately 2 μm.

In the exemplary embodiment, the semiconductor mesa 20 and the sidewalls 21 extend in the vertical direction $e_n$ as far as a third surface 103 of the semiconductor body 40, which third surface is arranged at the height $h_M$ above the first surface 101 and is substantially parallel to the first and second surfaces 101, 102 and forms a top side 103 of the semiconductor body 40.

In other embodiments, the sidewalls 21 are inclined relative to the first and/or the second surface 101, 102.

Moreover, the surface 103 of the semiconductor mesa 20 in the vertical cross-sectional view can also be multipartite and/or at least partly curved. In these embodiments, the semiconductor mesa 20 likewise defines a top side 103 of the semiconductor body 40, which top side is substantially parallel to the first and second surfaces 101, 102 and is situated at the distance $h_M$ from the first surface 101.

Since the mesa 20 or the plurality of semiconductor mesas 20 form or at least define the top side 103, the top side 103 is also designated hereinafter as the mesa top side 103.

Typically, the semiconductor body 40 has in an active region 110 a multiplicity of semiconductor mesas 20 extending from the first surface 101 as far as the top side 103, wherein adjacent semiconductor mesas in the vertical cross-sectional view are separated from one another by a respective deep (vertical) trench 50 having the depth $h_M$. FIG. 1A then corresponds to a left edge excerpt from a corresponding cross section whose right edge excerpt is typically implemented mirror-symmetrically with respect to FIG. 1A. The active zone 110 is typically surrounded by the edge zone 120 in a plan view.

In accordance with one embodiment, the semiconductor body 40 in the vertical cross section further has a drift region 1 (also designated hereinafter as drift zone) of the first conduction type, a body region 2 (also designated hereinafter as body zone) of the second conduction type and a source region 3 (also designated hereinafter as source zone) of the first conduction type. In this case, the drift region 1 extends in the edge zone 120 and in the deep trench 50 as far as the first surface 101 and partly right into the semiconductor mesa 20 of the active zone 110. By contrast, the source region 3 is arranged completely and the body region 2 is arranged at least predominantly in the semiconductor mesa 20. The body region 2 forms a first pn junction 14 with the drift region 1 and a second pn junction 15 with the source region 3, said second pn junction being arranged above the first pn junction 14 and extending as far as the sidewalls 21.

Typically, a multiplicity of mesas 20 are arranged in the active zone, said mesas being separated from one another by respective deep trenches 50. As is explained in detail further below with reference to FIGS. 3 to 9, such a semiconductor structure can be produced particularly effectively and cost-effectively inclusive of optional edge structures. In this case, the process steps for producing a double-diffused MOS basic structure (implantation, diffusion for producing the body and source regions 2, 3), these process steps being more sensitive in terms of process engineering, are performed before any topography is produced on the wafer. As a result, with effective area utilization comparable to that for conventionally produced trench MOSFETs, additional variations as a result of steps and edge effects at the mesas 20 can be at least largely avoided and the process variations can thus be considerably reduced. Since the source and body regions 2, 3 in the edge zone 120 are likewise removed during the mesa etching, the additional process outlay for an edge construction can moreover be significantly reduced or even entirely obviated.

In accordance with one embodiment, the first pn junction 14 extends between the two sidewalls 21 of the semiconductor mesa 20, wherein a vertical distance d between the pn junction 14 and the semiconductor mesa top side 103 varies in the horizontal direction, i.e. is a non-constant function of the horizontal distance from a sidewall 21, and assumes its largest value $d_1$ in a central zone 2c—spaced apart from the two sidewalls 21—of the semiconductor mesa 20, i.e. in a middle or central zone 2c of the semiconductor mesa 20 in relation to the horizontal direction. In this case, the largest value $d_1$ is at least 70% of the height $h_M$, more typically at least 80% of the height $h_M$, and even more typically at least 90% of the height $h_M$. Typically, the largest value $d_1$ is less than 200% of the height $h_M$, e.g. less than 150% of the height $h_M$, more typically less than 120% of the height $h_M$, and even more typically less than 110% of the height $h_M$. The choice of the largest value $d_1$ can depend on the voltage class of the semiconductor component 100a and the absolute height (trench depth) $h_M$. In this regard, in the case of very shallow semiconductor mesas 20 having a height $h_M$ of 500 nm or less, the largest value $d_1$ can also be greater than 200% of the height $h_M$, e.g. approximately 300% of the height $h_M$. In the exemplary embodiment illustrated in FIG. 1A, the vertical distance d between the pn junction 14 and the semiconductor mesa top side 103 is piecewise constant as a function of the horizontal distance from a sidewall 21 and assumes its minimum value $d_2$ at and near the sidewalls 21, which minimum value is less than the height $h_M$ and can be e.g. in a range of 50% to 90% of the height $h_M$.

As a result, the body region 2 extends into the drift region 1 vertically more deeply in the central zone of the mesa 20, which has the effect that the field lines intensify there in the off-state case, i.e. if the first pn junction 14 is operated in the reverse direction, such that at correspondingly high reverse voltages the avalanche breakdown will commence in the drift region 1 below the central zone 2c. A higher stability of the component in particular in relation to repetitive avalanche breakdowns can be obtained in this way.

For this purpose, the first pn junction 14 and the body zone 2 in the vertical cross section can be embodied mirror-symmetrically relative to a central vertical axis through the mesa 20, in order to pin the avalanche breakdown location in the horizontal direction substantially centrally relative to the mesa 20 and, as a result, to keep the avalanche current away from both sidewalls 21 of the mesa 20 and dielectrics typically applied there, which can thus be protected against the incorporation of high-energy charge carriers ("hot charge carrier"). However, the pn junction 14 can also be embodied asymmetrically with respect thereto, in order to suitably carry away the current in avalanche breakdown.

Moreover, provision can be made for the body region 2 to have a higher maximum dopant concentration in the vicinity of the pn junction and in the central zone 2c than in zones of the body region 2 that are located nearer to the sidewalls 21. As a result, the focusing of the electric field lines in the off-state case and thus of the current lines in avalanche breakdown can be improved further. In other words, the gradient of the dopant concentration at the first pn junction can vary in the horizontal direction and assume a largest value in a central zone 2c spaced apart from the two sidewalls 21. In particular, the body region 2 can have a partial zone having an increased dopant concentration in the central zone 2c, as is explained in detail below with reference to FIG. 1B.

Figure 1B:
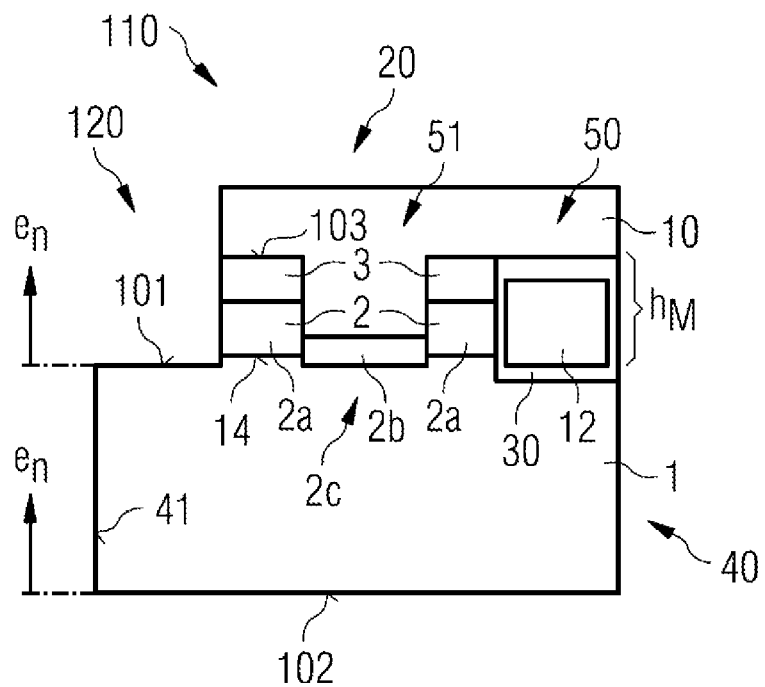

In the exemplary embodiment of a field effect component 100b illustrated as a vertical cross section in FIG. 1B, the semiconductor body 40 comprises a drift region 1, which extends in the edge region 120 as far as the first surface 101 and which is arranged partly in the semiconductor mesa 20, and a body region 2, which is arranged at least partly in the semiconductor mesa 20 and which comprises two first partial zones 2a, each adjoining one of two sidewalls 21 of the semiconductor mesa 20, and a second partial zone 2b arranged between the first partial zones 2a, wherein the two first partial zones 2a and the second partial zone 2b form a first pn junction 14 with the drift region 1, said first pn junction extending between the two sidewalls 21 of the semiconductor mesa 20, wherein the second partial zone 2b extends into the drift region 1 vertically more deeply than the two first partial zones 2a, and wherein the second partial zone 2b has a greater maximum dopant concentration than the two first partial zones 2a.

Since the second partial zone 2b of the mesa 20 arranged in the central zone 2c extends into the drift region 1 vertically more deeply and has a higher dopant concentration than the adjoining first partial zones 2a, the electric field lines are concentrated there in the off-state case in such a way that at correspondingly high reverse voltages the avalanche breakdown will commence in the drift region 1 below the central zone 2c. A higher stability of the component in particular in relation to repetitive avalanche breakdowns can be obtained in this way.

Typically, the maximum dopant concentration of the second partial zone 2b is increased by at least a factor of five, more typically by at least a factor of 10, relative to the maximum dopant concentration of the first partial zones 2a.

Typically, a maximum vertical first distance (not depicted in FIG. 1B for reasons of clarity, corresponds to $d_2$ in FIG. 1A) between the top side 103 and first sections of the first pn junction 14 which are formed in each case between one of the two first partial zones 2a and the drift region 1 is less than a vertical distance $h_M$ between the top side 103 and the first surface 101; and a maximum vertical second distance (likewise not depicted in FIG. 1B for reasons of clarity, corresponds to $d_1$ in FIG. 1A) between the top side 103 and a second section of the first pn junction 14, said second section being formed between the second partial zone 2b and the drift region 1, is greater than the maximum vertical first distance. In a manner analogous to that explained above with reference to FIG. 1A, however, the maximum vertical second distance can also be greater than 200% of the height $h_M$.

Typically, a gate dielectric zone 30, e.g. a thermal oxide, and a gate electrode 12 adjoining the gate dielectric zone 30, and a source metallization 10 arranged on the semiconductor mesa 20 and in ohmic contact with the body zone 2 and the source zone 3 are arranged on at least one of the sidewalls of the mesa 20, wherein the gate electrode 12 situated in a trench is insulated from the source metallization. Moreover, a drain metallization (not illustrated in FIG. 1B) in ohmic contact with the drift zone 1 is typically arranged on the rear side 102, such that the field effect component 100b can be operated as a vertical MOSFET.

While the source metallization 10 is typically arranged only above the first pn junctions 14, the gate electrode 12 is typically arranged partly above and partly below the first pn junctions 14, but typically likewise only above the first surface 101.

In the exemplary embodiment, the source regions 3 and the second partial zone 2b are ohmically connected to the source metallization 10 via a trench contact situated in a shallow trench 51, wherein the second partial zone 2b can simultaneously perform the function of a body contact zone for the first partial zones 2a comprising a respective channel region, in order to enable a good latch-up strength. In other embodiments, the second partial zone 2b extends as far as the top side 103 or at least almost as far as the top side 103. In further embodiments, the second partial zone 2b is ohmically connected to the source metallization 10 arranged on the top side 103 via a correspondingly highly doped half-region, which is arranged above the second partial zone 2b and which can also function as a body contact region, or a silicide zone.

Figure 2:
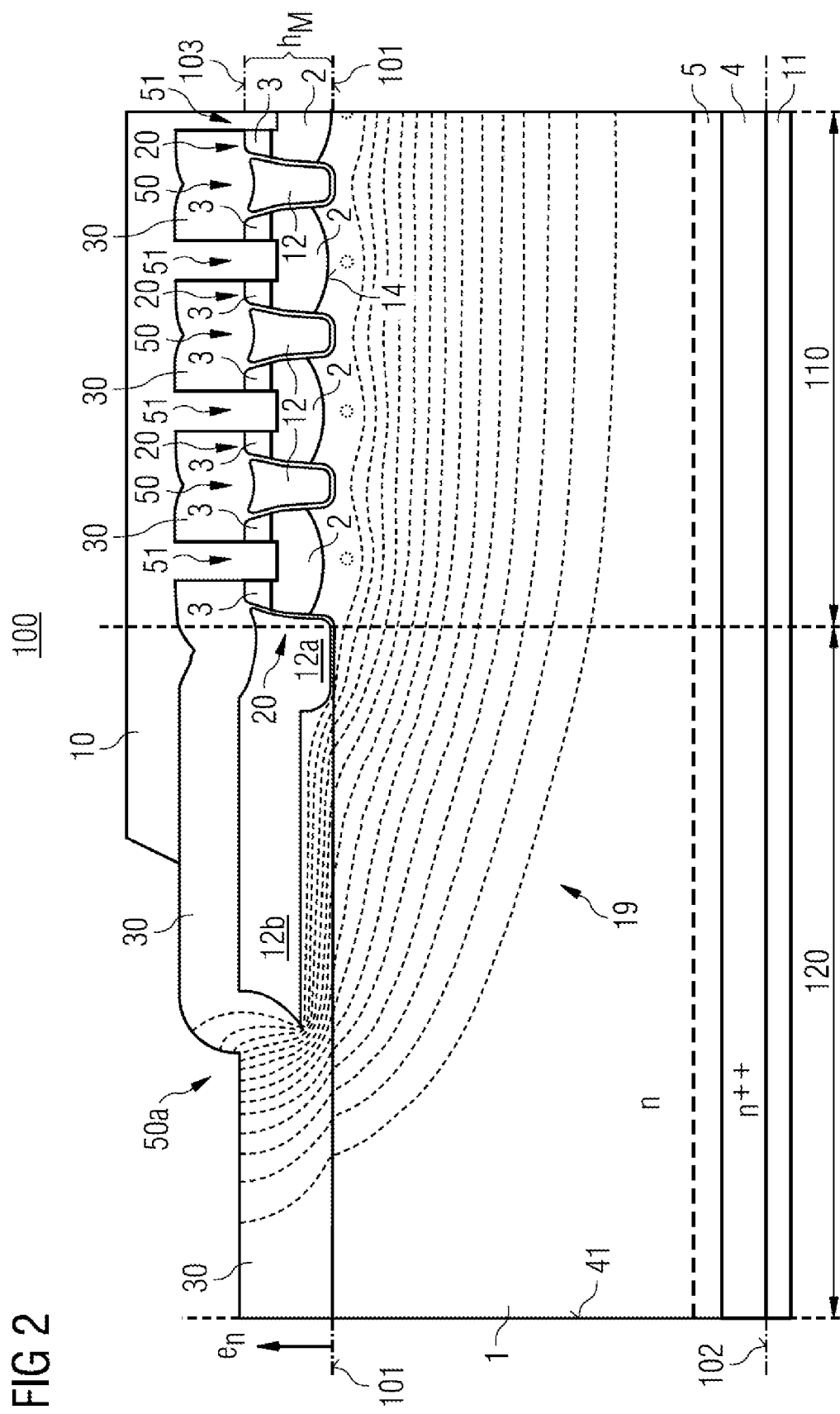
FIG. 2 shows a vertical cross section through a field effect semiconductor component in accordance with one embodiment.

FIG. 2 shows a left excerpt from a vertical cross section through a field effect component 100. The field effect component 100 is similar to the field effect components 100a, 100b explained above with reference to FIGS. 1A and 1B and can likewise be operated as a MOSFET. However, a multiplicity of mesas 20 are arranged in the active zone 110. Moreover, a drain metallization 11 is arranged on the rear side 102, said drain metallization being in ohmic contact with the drift region 1 via a more highly doped drain region 4. Moreover, the first pn junctions 14 between the body regions 2 and the drift region 1 in the exemplary cross-sectional illustration shown are in each case not piecewise linear but rather curved in such a way that the vertical distance between the respective first pn junctions 14 and the top side 103 firstly rises as a function of the horizontal distance from a sidewall of the respective mesa 20, then assumes a largest value, and then falls again upon approaching the second respective sidewall.

This leads to the focusing of the electric field lines in the off-state case and thus of the current lines in avalanche breakdown. This becomes clear from the equipotential lines 19 in avalanche breakdown, which are additionally depicted in FIG. 2 and to which the electric field lines or the current lines are perpendicular. Moreover, the zones of highest impact ionization are represented by dotted small circles in FIG. 2. It becomes clear therefrom that it is possible to pin the commencement of avalanche breakdown below the first pn junctions and in each case approximately centrally in the horizontal direction relative to the respective mesa 20. As shown by a more precise analysis of the underlying numerical simulation, it is thereby possible for the avalanche current firstly to be distributed uniformly among the mesas 20 and secondly to be kept away effectively from the sidewalls of the mesas 20 and thus from the gate dielectrics 30 arranged between the gate electrodes 12, 12a and the mesas 20. This significantly increases the robustness of the exemplary n-channel MOSFETs 100 in relation to repetitive avalanche breakdowns, such that the MOSFET 100 is well suited to corresponding applications, in particular power applications such as motor control. Inductive loads can generate large voltage spikes during the switching process, and the semiconductor switch 100 is well protected against said spikes by means of the avalanche effect (avalanche multiplication effect) proceeding in a defined manner upon breakdown. Consequently, a corresponding external snubber can be obviated.

From the profile of the equipotential lines 19 with respect to the side face 41, it additionally becomes clear that the electrical equipotential lines 19 can be set in a very flat manner below the entire structured area owing to the deeper edge zone 120, which extends only as far as the first surface 101 in the vertical direction. This is particularly advantageous for the additional embedding of auxiliary structures (not illustrated) such as current or temperature sensors and gate fingers in the active zone (cell array zone) 110. In particular, it is possible to avoid an increased electric field in the semiconductor body 40 at the corners of the deep trenches 50, 50a of the edge cells (toward the edge 41 and/or toward auxiliary structures) and thereby to improve the reliability of the transistor. Typically, the deep trenches 50, 50a extend into the semiconductor body to the same depth $h_M$. However, provision can also be made for the deep trenches 50 in the active zone 110 to extend into the semiconductor body somewhat more deeply than the deep trench 50a in the edge zone 120 and/or for the drift region 1 or the semiconductor body also to extend somewhat higher in the edge zone 120 in the vicinity of the side face 41 than in the active zone 110, but not as far as the top side 103.

Provision can additionally be made for the avalanche breakdown current to be carried away substantially only via some of the mesas 20, e.g. via every second or third semiconductor mesa 20, e.g. by virtue of the fact that the body regions of the other mesas do not extend as deeply into the drift region 1 at least in the central zone.

In accordance with one exemplary embodiment, at least one edge termination structure 12b is provided in the edge zone 120 of the component 100, and is arranged between the semiconductor mesas 20 and the side face 41 in a plan view. The blocking capability of the semiconductor component 100 can be improved as a result. Typically, the edge zone in the cross section shown has a horizontal extent in a range of approximately 30 µm to approximately 50 µm or to approximately 100 µm or even to approximately 200 µm.

In the exemplary embodiment illustrated in FIG. 2, the edge termination structure is embodied as a field plate 12a, 12b which is arranged on the first surface 101 and whose section 12a adjoining the mesa 20 nearest the edge also functions as a gate electrode. However, this is only an example. The edge termination structure can also comprise a field plate connected to the source metallization 10, a floating field plate, one or a plurality of floating p-doped semiconductor regions ("floating guard rings") embedded in the drift region 1 near the first surface 101, a so-called VLD structure ("variation of lateral doping") and/or a highly n-doped channel stop region arranged at least near the first surface 101 and the side face 41.

Methods for producing the field effect semiconductor components explained with reference to FIGS. 1A to 2 are described below. In this case, FIGS. 3 to 9 each illustrate a vertical cross section through the semiconductor component structure.

Firstly, a semiconductor wafer 40, e.g. a silicon wafer, is provided, which is also designated as wafer 40 hereinafter. The semiconductor wafer 40 comprises an n-doped monocrystalline first semiconductor layer 1, a p-doped monocrystalline second semiconductor layer 2, which is arranged on the first semiconductor layer 1 and which forms a first pn junction 14 with the first semiconductor layer 1, and an n-doped monocrystalline third semiconductor layer 3, which is arranged on the second semiconductor layer 2 and which is more highly doped than the first semiconductor layer 1, forms a second pn junction 15 with the second semiconductor layer 2 and extends as far as a top side 103 of the wafer 40. In manufactured field effect semiconductor component 100, remaining parts of the first semiconductor layer 1, of the second semiconductor layer 2 and of the third semiconductor layer 3 form a drift region 1, body regions 2 and source regions 3, respectively.

In accordance with one exemplary embodiment, a dielectric layer 31 is produced over the whole area on the top side 103, e.g. by deposition or by thermal oxidation.

Figure 3:
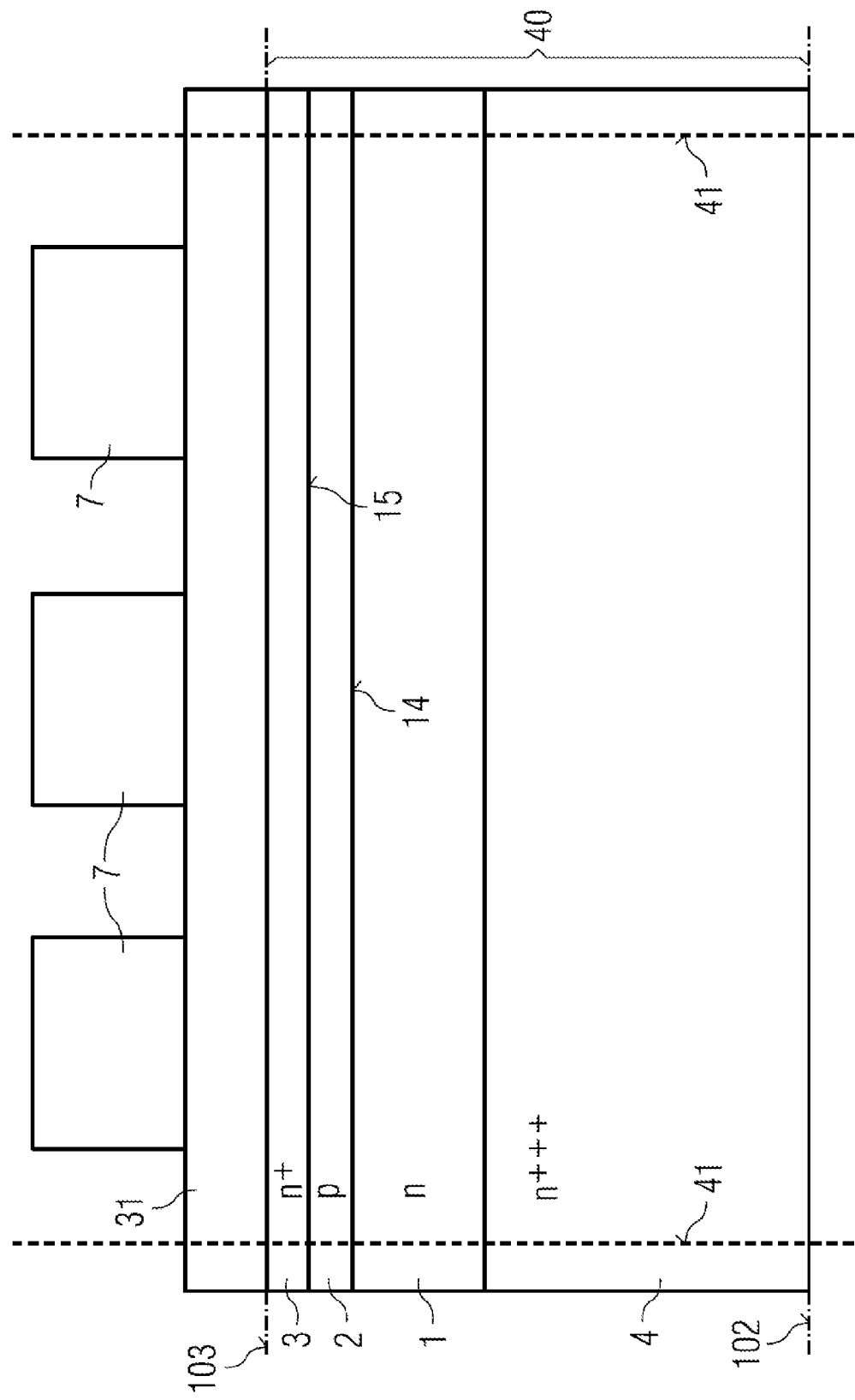

Afterward, a photopatterned mask 7 is produced on the top side 103 of the wafer 40 with a plurality of openings, said mask subsequently being used for producing semiconductor mesas and therefore also being designated as mesa mask 7. The resultant structure 100 is shown in FIG. 3. FIG. 3 represents typically only a small excerpt from the entire wafer 40, and then illustrates substantially one semiconductor component from a multiplicity of semiconductor components 100 to be manufactured in parallel, said semiconductor component's side faces (sawing edges) 41 that arise after a later sawing process being illustrated by dashed vertical lines in FIG. 3. Typically, first openings in the mask 7 in later separating regions in the vertical cross-sectional view shown have a larger horizontal extent (or a larger opening area in the plan view) than second openings in the mask 7 between the first openings.

As is illustrated in FIG. 3, the wafer 40 typically additionally comprises an n-doped monocrystalline fourth semiconductor layer 4, which is more highly doped than the first semiconductor layer 1, extends as far as the rear side 102 of the wafer and typically forms a drain region 4 in the manufactured component 100. The fourth semiconductor layer 4 can directly adjoin the first semiconductor layer 1. In other embodiments, there is arranged between the fourth semiconductor layer 4 and the first semiconductor layer 1 a further n-doped semiconductor layer, the maximum dopant concentration of which is typically in a range between the maximum dopant concentration of the first semiconductor layer 1 and the maximum dopant concentration of the fourth semiconductor layer 4 and which can form a field stop layer in the manufactured semiconductor component.

The first, second and third semiconductor layer 1, 2, 3 can be produced by epitaxy and corresponding implantations and thermal annealing. This is typically effected such that the first pn junction 14 and the second pn junction 15 are substantially parallel to one another and to the top side 103 and the rear side 102.

Figure 4:
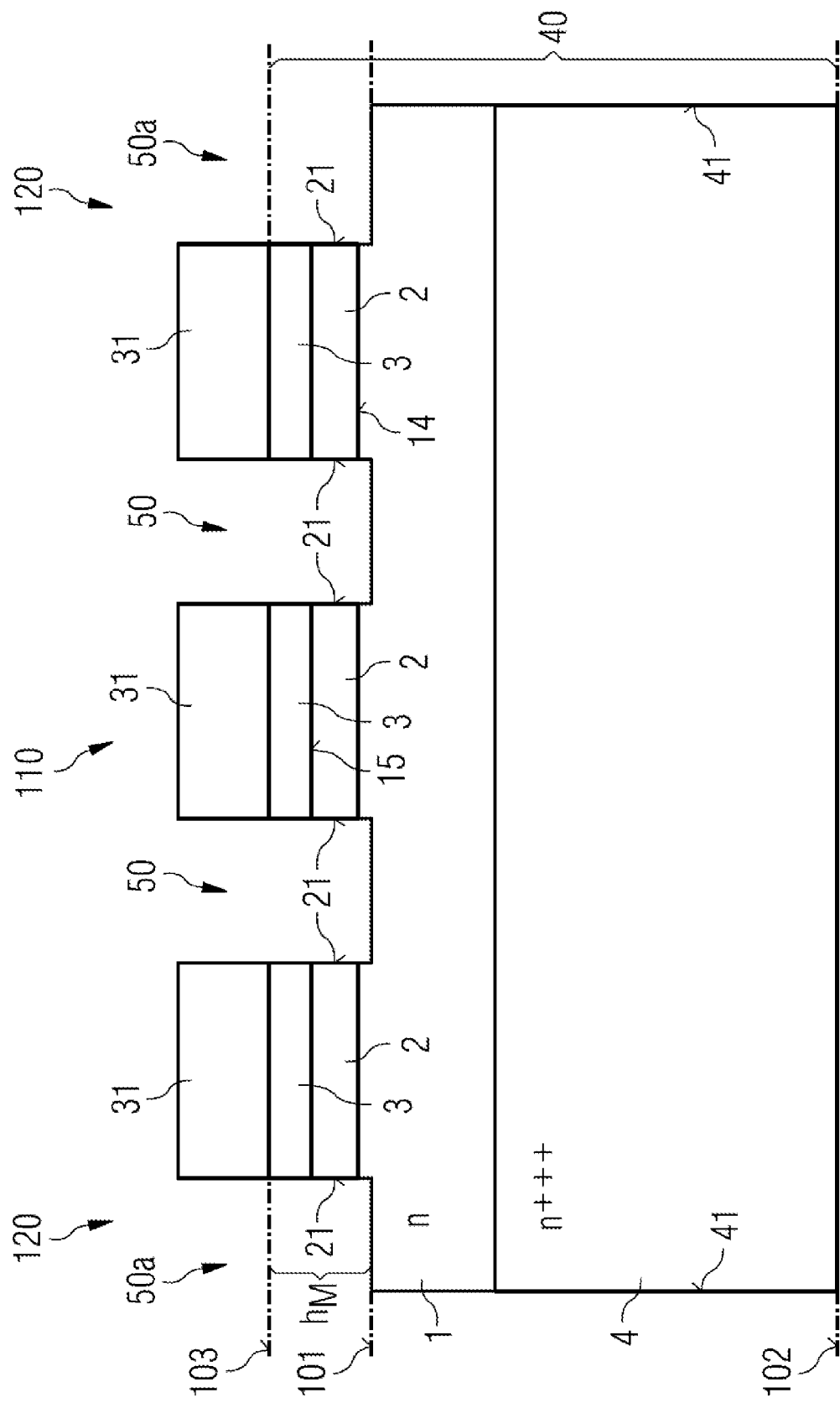

The wafer 40 can then be etched using the mesa mask 7, the dielectric layer 31 also being etched. This is effected in such a way as to give rise to deep trenches 50, 50a and semiconductor mesas 20 having the height $h_M$ that are arranged between the deep trenches 50, 50a, wherein the deep trenches 50, 50a extend into the first semiconductor layer 1 as far as a first surface 101, which is substantially parallel to the rear side 102. The resultant structure 100 is shown in FIG. 4.

Typically, the deep trenches 50, 50a extend right into the first semiconductor layer 1 in a range of approximately 500 nm to approximately 2 µm or even approximately 5 µm.

Typically, the deep trenches 50a situated in the edge zones 120 in the vertical cross section shown have a larger horizontal extent than the deep trenches 50 situated in the active zone 110. This simplifies the later production of edge termination structures in the edge zones.

Insulated gate electrodes 12, 12a can then be produced in the deep trenches 50, 50a. In this case, typically further dielectric zones 33 are produced at the bottom of the deep trenches 50, 50a and at the sidewalls 21 of the mesas 20 or of the deep trenches 50, 50a, e.g. by thermal oxidation or by means of a deposition process. Afterward, the deep trenches 50, 50a can be filled partly with a conductive material, e.g. highly doped polysilicon, in order to produce the gate electrodes 12, 12a. This can be effected e.g. by deposition and subsequent partial etching-back of the deposited material. In this case, provision can be made for producing the further dielectric zones 33 in such a way that the thickness of the further dielectric zones 33 in the deep trenches 50a differs from that in the deep trenches 50 and/or that the thickness of the further dielectric zones 33 at the sidewalls 21 differs from that at the bottom of the respective deep trench 50, 50a or of the corresponding mesa 20. Moreover, provision can be made for producing in each case a further dielectric zone 34 on the gate electrodes 12 (12a), e.g. by thermal oxidation of the deposited polysilicon.

In accordance with a further exemplary embodiment, the insulated gate electrodes 12a in the deep trenches 50a are embodied such that they are simultaneously shaped as field plates which are insulated from the semiconductor and which extend above the first surface 101 and in the direction of the respectively adjacent side face 41 and can have one or a plurality of steps. In this exemplary embodiment, the further dielectric zones 33 in the deep trenches 50a can be formed such that their thickness, i.e. their vertical extent, increases in one or a plurality of steps toward the nearest side face 41.

Figure 5:
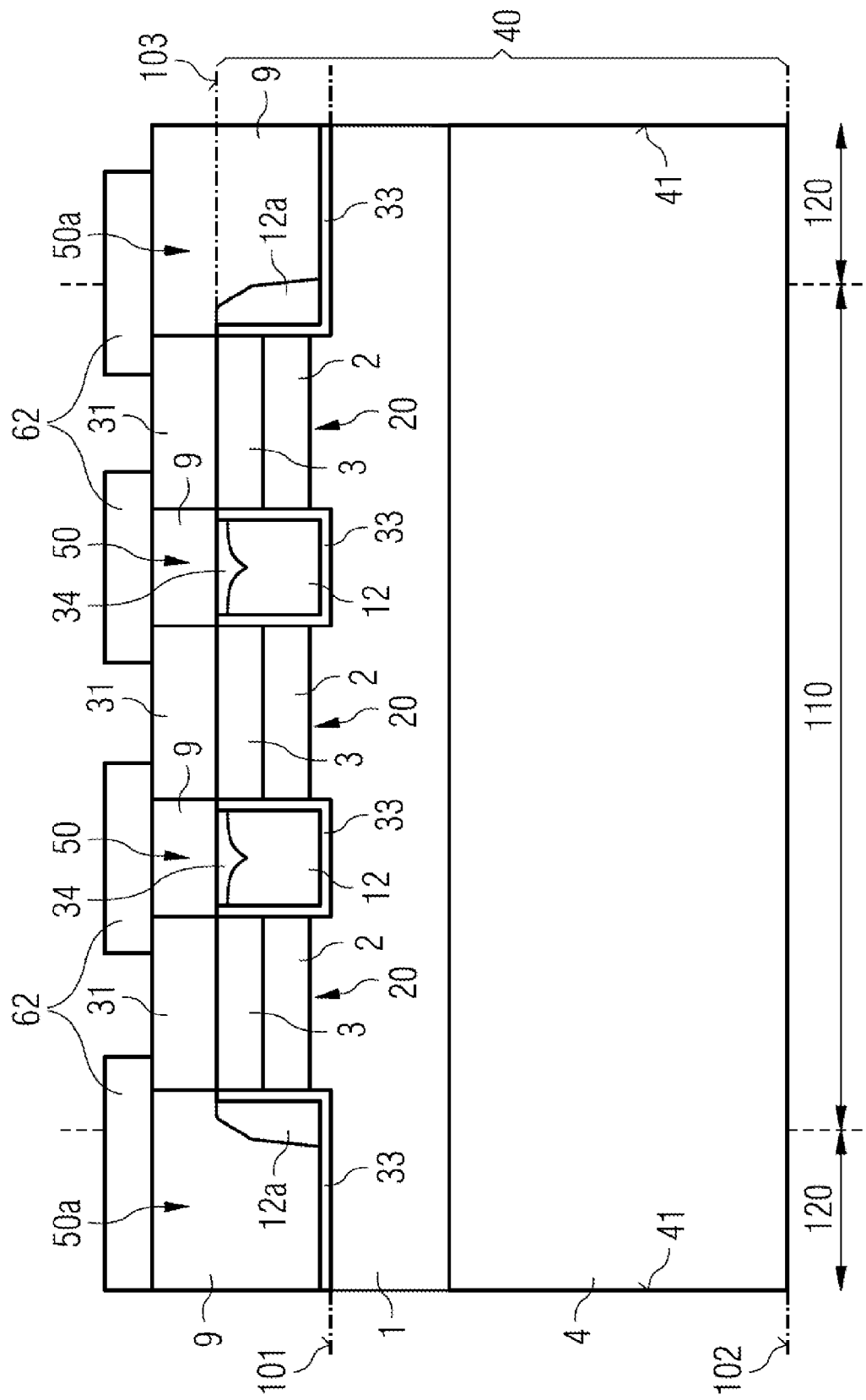

Afterward, an intermediate dielectric 9, e.g. an oxide such as TEOS (tetraethyl orthosilicate), for instance, can be deposited from the top side 103 in order to cover the gate electrodes 12, 12a. In a subsequent planarization process, e.g. a CMP process (chemical mechanical polishing), it is possible to produce a plane situated above the top side 103 for a contact-making lithography. FIG. 5 shows the structure 100 after a corresponding photomask 62 has been produced on the top side 103.

Figure 6:
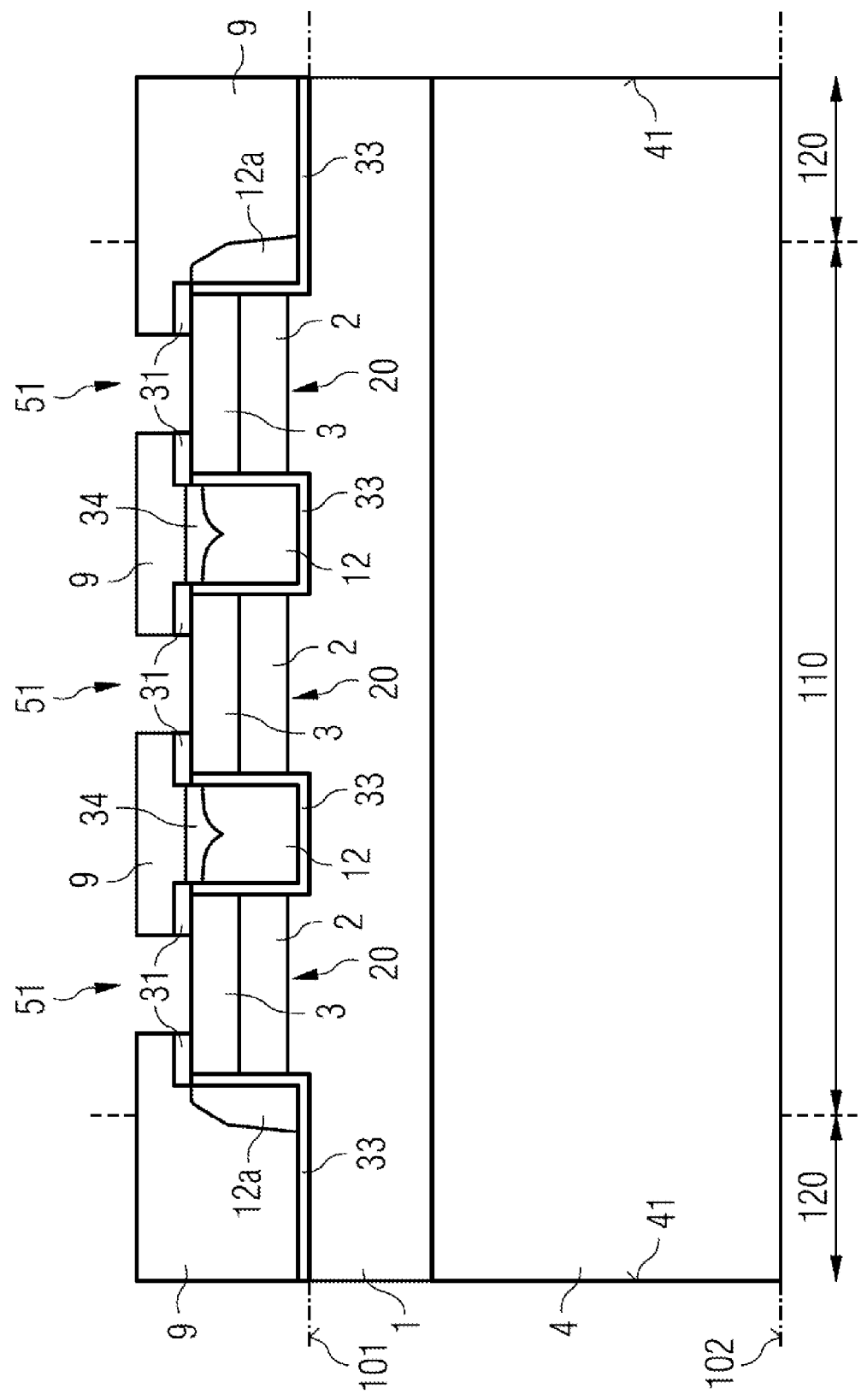

Shallow trenches 51 are subsequently etched by means of the photomask 62 through the intermediate dielectric 9 and the parts of the dielectric layer 31 that remained after the mesa etching on the mesas 20, in order to partly uncover the source regions 3 of the mesas 20 in central zones. FIG. 6 shows the structure 100 after the photomask 62 has been removed again. In other embodiments, the dielectric layer 31 on the mesas 20 is removed again before the formation of the gate electrodes 12, 12a, typically even before the formation of the dielectric zones 33 in the deep trenches 50, 50a.

The shallow trenches 51 can then be deepened by a further etching step, such that the shallow trenches 51 extend through the source regions 3 as far as the body regions 2 or even partly into the body regions 2, but typically not right into the drift zone 1.

As an alternative thereto, the shallow trenches 51 can also be etched in an etching step through the intermediate dielectric 9, the dielectric layer 31 and the source regions 3.

Figure 7:
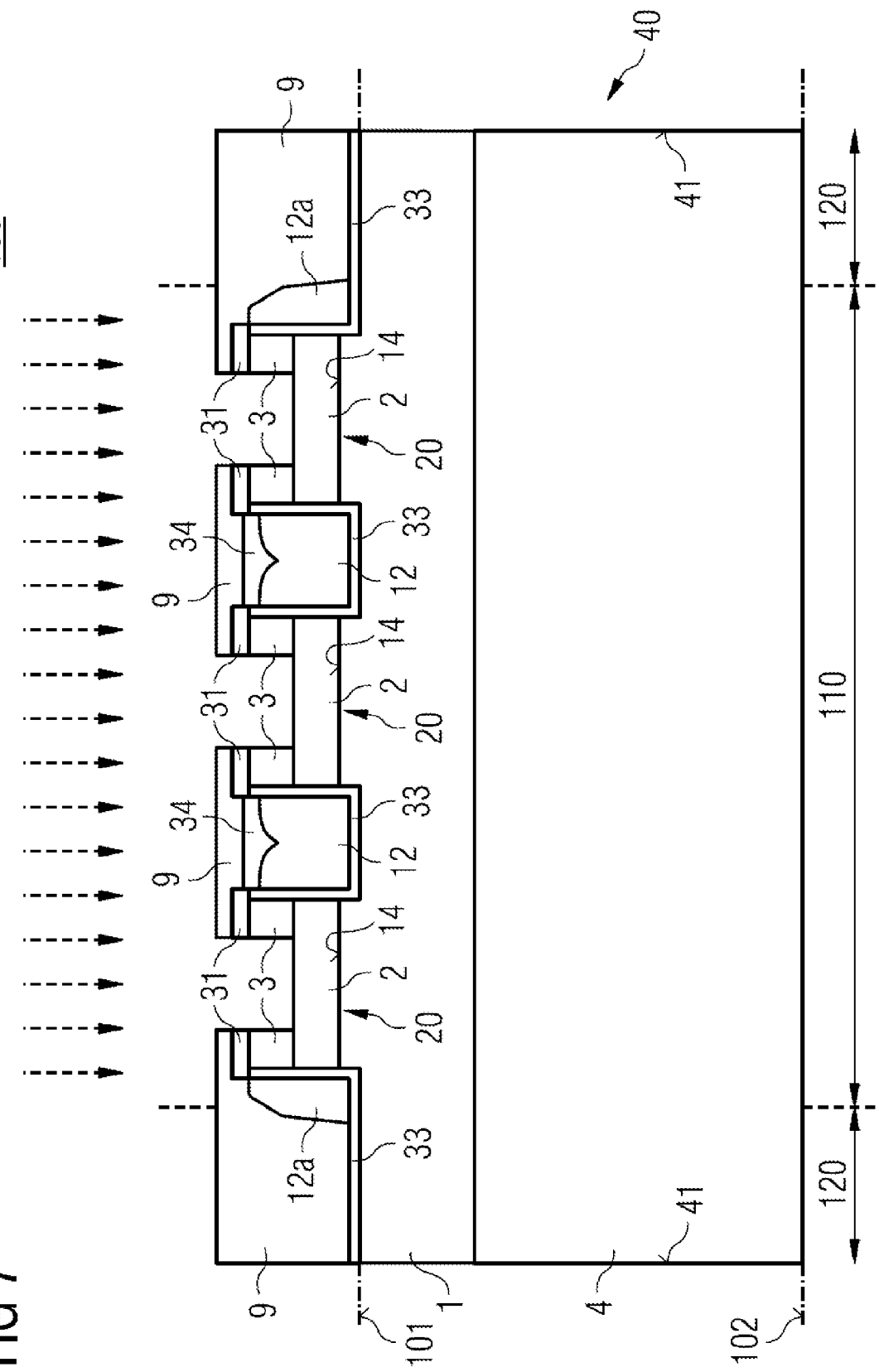

As illustrated by the dashed arrows in FIG. 7, p-type dopants (e.g. boron) can then be implanted into the body zones 2 and/or the drift zone 1 from the top side 103 through the shallow trenches 51. If a p-channel field effect semiconductor component is intended to be produced instead of an n-channel field effect semiconductor component, the shown dopings of n- and p-doped zones are interchanged and n-type dopants (e.g. phosphorus) should be implanted from the top side 103 in this step.

In this case, it is also possible to carry out a plurality of implantations to different depths, wherein at least one of the plurality of implantations can be effected just above or below the first pn junctions 14, i.e. in a vertical range around the first pn junctions 14 that corresponds e.g. to 10% of the height $h_M$.

Typically one to three p-type implantations are carried out depending on the vertical depth of the shallow trenches 51. In this regard, in the case of relatively deeply extending shallow trenches 51, one p-type implantation can suffice, which moreover is typically effected with such a high dose that the zones adjoining the respective shallow trench 51 (after a heat treatment), can also act as a body contact region (in this respect, also see FIG. 1B). Moreover, a plurality of p-type implantations can also be implemented instead of the shallow trenches 51 extending into the semiconductor body 40.

A subsequent heat treatment step then has the effect that the implanted dopants are activated, such that the first pn junctions 14 extend into the first semiconductor layer 1 vertically more deeply in a central zone 2c between the deep trenches 50, 50a than at or in the vicinity of the sidewalls 21 of the semiconductor mesa 20, as is shown in FIG. 8. During the heat treatment step, the dopants can at least partly also diffuse into the first semiconductor layer 1 more deeply depending on temperature, semiconductor material and dopant. The heat treatment step can be implemented for example as a so-called "rapid thermal annealing" process.

Since variations at the mesas 20 during the implantation for the second partial zones 2b contribute to the dopant distribution only to an at most very small extent, the method can be performed with very low process variability.

The method is typically carried out such that the dopant concentration is increased in the central zone 2c spaced apart from the sidewalls 21 of the respective semiconductor mesa 20 above and near the respective first pn junction 14.

The method is typically performed in such a way that a maximum vertical first distance between the top side 103 and first sections of the first pn junction 14 that adjoin a respective sidewall 21 is less than a maximum vertical second distance between the top side 103 and respective second sections of the first pn junction 14, which are arranged in each case between two of the first sections of the first pn junction 14. Typically, the maximum vertical second distance is in a range of approximately 80% to approximately 150% of the vertical distance ($h_M$), but can be chosen to be even larger or else smaller, depending on the component class. Moreover, the method can be performed in such a way that a maximum vertical distance ($|d_1-h_M|$) between the first pn junction 14 in the central zone 2c of the respective semiconductor mesa 20 and the first surface 101 is less than 30%, more typically less than 20% or even less than 10%, of the height $h_M$ of the semiconductor mesas 20. As was explained above with reference to FIGS. 1A to 2, the first pn junction 14 in the respective central zone 2c can, however, also extend into the drift region 1 even more deeply.

It is then possible to produce a trench contact in the shallow trenches 51 and a source metallization 10 above the first surface 101 e.g. by depositing a conductive material (e.g. a metal or conductive polysilicon) and a further optional planarization process. Beforehand, a silicide can optionally be formed at the sidewalls and/or bottom walls of the shallow trenches 51.

FIG. 9 shows the MOSFET 100 after a drain metallization 11 was produced on the rear side 102 and the wafer 40 was separated into individual semiconductor components along the wider deep trenches 50a.

By means of the method explained, avalanche-resistant semiconductor components 100, 200 comprising a body region 2 can be produced very reliably and with small process fluctuations, each of said semiconductor components having a second partial zone 2b which is arranged in the central zone 2c, forms a part of the pn junction 14 with the drift region 1 and has a higher maximum dopant concentration and/or extends into the drift region 1 more deeply than a first partial zone 2a of the body region 2 that adjoins the second partial zone 2b.

Although various exemplary embodiments of the invention have been disclosed, it will be obvious to the competent person skilled in the art that various changes and modifications can be made, with which some of the advantages of the invention are achieved, without thereby departing from the essence and scope of the invention. Furthermore, it is evident to the person of average skill in the art that other component parts which fulfill the same functions can be correspondingly exchanged. It should be pointed out that features explained with reference to a specific figure can be combined with features of other figures, specifically even in such cases in which this is not expressly mentioned. Such modifications of the inventive concept are intended to be concomitantly encompassed by the appended claims.

Spatially relative terms such as "under", "below", "lower", "above", "upper" and the like are used in the interest of a better description in order to set out the relative positioning of an element in relation to a second element. These terms are intended to encompass different orientations of the components besides the various orientations described in the figures. Furthermore, expressions such as "first", "second" and the like are also used in order to describe different elements, zones, regions, etc., and are likewise not intended to be restrictive. Throughout the description, identical terms relate to identical elements.

In the present usage, the terms "have", "contain", "include", "comprise" and the like are terms kept open which indicate the presence of specified elements or features but do not preclude additional elements or features. The articles "a(n)" and "the" are intended to encompass both the plural and the singular, unless clearly indicated otherwise in the context.

In view of the above range of variation and application, it should be assumed that the present invention is restricted neither by the previous description nor by the accompanying drawings. Instead, the present invention is restricted exclusively by the following claims and the legal equivalents thereof.

The invention claimed is:

1. A field effect component, comprising a semiconductor body, which extends in an edge zone from a rear side as far as a surface of the semiconductor body, and which comprises a semiconductor mesa, which extends in a vertical direction, which is perpendicular to the rear side and/or the surface, as far as a semiconductor mesa top side arranged at a height above the surface, wherein the semiconductor body in a vertical cross section further comprises:
    a drift region, which extends at least in the edge region as far as the surface and which is arranged partly in the semiconductor mesa; and
    a body region, which is arranged at least partly in the semiconductor mesa and which forms a first pn junction with the drift region, said first pn junction extending between two sidewalls of the semiconductor mesa, wherein a vertical distance between the first pn junction and the semiconductor mesa top side varies in a horizontal direction and assumes a largest value in a central zone spaced apart from the two sidewalls, and wherein the largest value is at least 70% of the height.

2. The field effect component as claimed in claim 1, wherein the largest value is less than 200% of the height.

3. The field effect component as claimed in claim 1, wherein the body region has a second partial zone arranged in the central zone, said second partial zone forming a part of the first pn junction with the drift region and having a higher maximum dopant concentration than a first partial zone adjoining the second partial zone.

4. The field effect component as claimed in claim 1, wherein the first pn junction in the vertical cross section is either mirror-symmetrical relative to a vertical axis or asymmetrical with respect thereto.

5. The field effect component as claimed in claim 1, wherein the semiconductor mesa in the vertical cross section further has a source region, which is arranged on the body region and which forms a second pn junction with the body region.

6. The field effect component as claimed in claim 5, in the vertical cross section further comprising a gate dielectric zone arranged on at least one of the sidewalls, a gate electrode arranged on the gate dielectric zone, a source metallization arranged on the semiconductor body and in ohmic contact with the body region and the source region, and/or a drain metallization arranged on the rear side and in ohmic contact with the drift region.

7. The field effect component as claimed in claim 6, wherein the source metallization and the gate electrode are arranged above the surface.

8. The field effect component as claimed in claim 6, wherein the semiconductor body further comprises a side face extending between the rear side and the surface, and at least one edge termination structure arranged between the semiconductor mesa and the side face in a plan view.

9. The field effect component as claimed in claim 6, further comprising a shallow trench extending in the central zone from the semiconductor mesa top side right into the body region and/or as far as the first partial zone of the body region.

10. The field effect component as claimed in claim 1, wherein the semiconductor body has a multiplicity of semiconductor mesas in an active zone.

11. The field effect component as claimed in claim 10, in the active region further comprising a temperature sensor, a current sensor and/or a gate finger.

12. The field effect component as claimed in claim 10, in the active zone further comprising a further semiconductor mesa comprising a body region, which forms a pn junction with the drift region, wherein the body region of the further semiconductor mesa does not extend into the drift region as deeply as the body region of the semiconductor mesa in the vertical direction.

13. A field effect component, comprising a semiconductor body, which extends in an edge zone from a rear side as far as a surface and which comprises a semiconductor mesa, which extends in a vertical direction, which is parallel to a normal vector of the rear side and/or a normal vector of the surface, as far as a semiconductor mesa top side arranged above the surface, wherein the semiconductor body in a vertical cross section further comprises:
    a drift region, which extends at least in the edge zone as far as the surface and which is arranged partly in the semiconductor mesa; and
    a body region, which is arranged at least partly in the semiconductor mesa and which comprises two first partial zones, each adjoining one of two sidewalls of the semiconductor mesa, and a second partial zone arranged between the two first partial zones, wherein the two first partial zones and the second partial zone form a first pn junction with the drift region, said first pn junction extending between the two sidewalls of the semiconductor mesa, wherein the second partial zone extends into the drift region vertically more deeply than the two first partial zones, and wherein the second partial zone has a greater maximum dopant concentration than the two first partial zones.

14. The field effect component as claimed in claim 13, wherein a maximum vertical first distance between the semiconductor mesa top side and a first section of the first pn junction, which is formed between one of the two first partial zones and the drift region, is less than a vertical distance between the semiconductor mesa top side and the surface, and/or wherein a maximum vertical second distance between the semiconductor mesa top side and a second section of the first pn junction, which is formed between the second partial zone and the drift region, is in a range of 80% to 150% of the vertical distance.

15. A method for producing a field effect component, comprising:
    providing a wafer, comprising a first semiconductor layer of a first conduction type, a second semiconductor layer of a second conduction type, which is arranged on the first semiconductor layer and which forms a first pn junction with the first semiconductor layer, and a third semiconductor layer, which is arranged on the second semiconductor layer and which forms a second pn junction with the second semiconductor layer and extends as far as a top side of the wafer;

forming a mesa mask on the top side of the wafer with a plurality of openings;

etching the wafer through the mesa mask, thus giving rise to deep trenches and semiconductor mesas arranged between the deep trenches, wherein the deep trenches extend right into the first semiconductor layer; and implanting dopants of the first conduction type into at least one semiconductor zone adjoining the first pn junction.

16. The method as claimed in claim 15, further comprising forming insulated gate electrodes in at least some of the deep trenches, and/or forming shallow trenches from the top side into the semiconductor mesas.

17. The method as claimed in claim 15, further comprising separating the wafer into semiconductor components along some of the deep trenches.

18. The method as claimed in claim 15, further comprising a heat-treatment act, wherein the wafer with first pn junction and second pn junction parallel to one another is provided, and wherein the method is performed in such a way that after the heat-treatment act the first pn junction extends into the first semiconductor layer vertically more deeply in a central zone in at least one of the semiconductor mesas than at sidewalls of the at least one semiconductor mesa.

19. The method as claimed in claim 18, wherein the method is performed in such a way that the first semiconductor layer outside the semiconductor mesas forms a first surface situated at a vertical distance from the top side, wherein a vertical first distance between the top side and a first section of the first pn junction, said first section adjoining a sidewall of one of the semiconductor mesas, is less than a vertical second distance between the top side and a second section of the first pn junction, which adjoins the first section of the first pn junction, and which is in a range of 80% to 150% of the vertical distance between the top side and the first surface.

20. The method as claimed in claim 15, wherein the method is performed in such a way that the dopant concentration is increased in at least one of the semiconductor mesas in a central zone above the first pn junction, said central zone being spaced apart from sidewalls of the at least one semiconductor mesa.

* * * * *